(12) United States Patent
Bisanti et al.

(10) Patent No.: US 6,191,629 B1
(45) Date of Patent: Feb. 20, 2001

(54) INTERLACED MASTER-SLAVE ECL D FLIP-FLOP

(75) Inventors: Biagio Bisanti, Antibes (FR); Akbar Ali, Garden Grove, CA (US)

(73) Assignee: Conexant Systems, Inc., Newport Beach, CA (US)

( * ) Notice: Under 35 U.S.C. 154(b), the term of this patent shall be extended for 0 days.

(21) Appl. No.: 09/405,964

(22) Filed: Sep. 27, 1999

(51) Int. Cl.[7] .................................................. H03K 3/289

(52) U.S. Cl. .......................................... 327/202; 327/218

(58) Field of Search ........................... 327/202, 203, 327/204, 208, 210, 211, 212, 218

(56) References Cited

U.S. PATENT DOCUMENTS 5,844,437 * 10/1999 Asazawa et al. ..................... 327/202
5,892,382 * 4/1999 Ueda et al. ........................... 327/202
5,969,556 * 10/1999 Hayakawa ............................ 327/202

OTHER PUBLICATIONS

Aytur, T. et al., A 2GHz, 6Mw BiCMOS Frequency Synthesizer, IEEE J. Solid–State Circuits, Paper FA 15.4, pp. 264–265, 1995.

* cited by examiner

Primary Examiner—Kenneth B. Wells
(74) Attorney, Agent, or Firm—Foley & Lardner

(57) ABSTRACT

A D flip-flop circuit operating in master-slave configuration which has low power consumption and is capable of high-speed operation, and a method for lowering power consumption in such a circuit is provided. The circuit embodiment includes two latches, each with a switching and memory section, and two interlaced current sources. In response to the active high clock signal the master latch memory section uses the current from the first current source while the slave latch switching section uses the current from the second current source, and vice versa. The switching section of each latch is biased with a higher current than the memory section, to provide the circuit with low power consumption. The output current provided to the switching section is preferably substantially twice the magnitude of the current provided to the memory section. The ratio of the currents of the current sources for the switching and memory section is preferably in the range of about 30% to 70%, depending on the clock frequency.

10 Claims, 4 Drawing Sheets

INTERLACED MASTER-SLAVE ECL D FLIP-FLOP

BACKGROUND OF THE INVENTION

1. Field of the Invention

The present invention relates generally to the field of flip-flop circuits and, in preferred embodiments, to an improved D flip-flop circuit which operates at high speed with low power consumption, usable in a dual modulus prescaler.

2. Related Art

A shift register is comprised of a number of elements, such as D flip-flops, cascaded in a string so that, upon clocking, the contents contained in each stage are moved, or shifted, either one stage to the left or the right. The bits of data, either 1 or 0, are passed on in order, so that the first bit in is the first bit out. The shifting takes place upon the rising or falling edge of the clock signal. Therefore, a two-stage shift register is a memory device that comprises two memory elements or cells connected together in a chain. Each cell in the chain is capable of remembering one bit of information. As a result, a two-stage shift register delays the input data for two pulses.

A data (D) flip-flop device in a master-slave configuration is a shift register element comprised of two separate latches 10, 12 and an inverter 14, as shown in FIG. 1. The output of the inverter 14 is coupled to the clock input of the second latch to supply an inverted clock signal to the second latch 12. This type of D flip-flop has been used, for example, in a dual modulus prescaler, often found in a Phase Locked Loop (PLL) of a frequency synthesizer. A data flip-flop has only one data (D) input and, regardless of the input level, the input is transferred to the output so that the next state of the output is determined by the current state of the input. A latch memory is a form of a D flip-flop that has the ability to remember a previous input and store it until the device is either cleared or the data is called up to be read by another device. When the latch enable input signal is high, the output follows the D input, similar to a D flip-flop. In this state, the latch is said to be transparent since the output follows the input. When the latch enable input signal is low, the output does not change and the latch is said to be in latch mode.

Some conventional circuits use a D flip-flop with multiple latch memory cells in a master-slave configuration. For example, a circuit of FIG. 2 has a first and a second latch cell. Each latch cell has a switching and a memory section. In the conventional circuit of FIG. 2, the D flip-flop circuit has four transistors 101, 103, 105, 107 in the input stage, a pair of differential data input terminals 100 and 102, a clock input terminal 104, a complement clock input terminal 106, a power supply 108, a pair of current sources 110, 112, a ground level 114, a pair of master switching transistors 116, 118, a pair of slave switching transistors 120, 122, a pair of master latching transistors 124, 126, a pair of slave latching transistors 128, 130, a pair of resistors 132, 134, each one on the collector of the respective transistor 124, 126, a pair of resistors 136, 138, each one on the collector of the respective transistor 128, 130, and a pair of differential output terminals 140, 142.

The clock input terminal 104 and the complement clock input terminal 106, which jointly serve as differential clock input terminals, are connected to respective bases of the transistors 101, 107 and 103, 105, respectively. The current sources 110, 112 are connected between the emitter inputs of the transistors 101, 107 and 103, 105, respectively, and the ground level 114. The current source 110 provides bias current to the master cell and the current source 112 provides bias current to the slave cell. The power supply 108 is connected at one end of the resistors 132, 134, 136, 138. Output terminals, output 140 and its complement output 142, are connected at the bases of the transistors 130, 128, respectively. The collector of the transistor 101 is commonly connected at the emitters of the transistors 116, 118. The collector of the transistor 103 is commonly connected at the emitters of the transistors 124, 126. The collector of the transistor 105 is commonly connected at the emitters of the transistors 120, 122. The collector of the transistor 107 is commonly connected at the emitters of the transistors 128, 130. The differential data signal input terminal 100 and its complement 102 are connected at the bases of the transistors 118, 116, respectively. The collectors of the transistors 118, 116 are connected at the bases of the transistors 126, 124, respectively. The collector of the transistor 124 is connected at the base of the transistor 126, and the collector of the transistor 126 is connected at the base of the transistor 124.

In this synchronous latch mode sequential circuit of FIG. 2 synchronization is obtained using a clock signal. The two latch cells in master-slave configuration operate one with an active high clock signal and the other with an active low clock signal. The data enters master cell when the clock signal is high. When the clock signal goes low, the data moves from the master cell to the slave cell and thus to the output. Output changes only on the clock edge. When the clock input signal applied to the transistors 101, 107 is of a high level, input signal level supplied to the differential data input terminals 100, 102 is provided to the transistors 124, 126, respectively, which are in a differential stage. When the clock input signal applied to the transistors 101, 107 is of a low level, the information which has been written into the transistors 124, 126 at a time the clock input signal is of a high level is latched by the slave latch that is composed of the transistors 128, 130 and stores the data. Therefore, the information present on the data input 100, at a time the clock input signal is of a high level, goes to the output 140 whenever the clock receives a low level signal.

In the conventional circuit of FIG. 2 both switching and memory sections of the master cell and slave cell use the same amount of current from each current source 110, 112, and the circuit needs a bias current from each current source 110, 112 to be on at all times. Therefore, in this circuit current consumption is high since it does not depend on the clock frequency, but on the magnitude of the chosen bias current. Switching speed of the circuit depends on the transistors' ft, load condition, and output voltage swing. The transistor's ft can be increased using higher bias current, but once the ft peak is reached, the ft and corresponding current cannot be exceeded any more. When the circuit is used in the integrated circuit of FIG. 2, the load condition is set by the resistive load 132, 134, the collector to substrate capacitance of the transistors at the output node, and the input impedance of the slave stage memory cell. Increasing the current will increase the transistors' ft but will decrease the resistive load to keep constant the output swing, so that the cell will switch faster. However, the higher the output voltage swing, the lower the cell's switching speed. Moreover, the output voltage swing cannot be decreased too much because of the noise immunity problem.

Another conventionally known circuit, used to lower power consumption in a prescaler, is described in the scientific article entitled: "A 2 GHz, 6 mW BICMOS Frequency Synthesizer", by Turgut Aytur and Behzad Razavi, 1995, pp. 264–265 of Digest of Technical Papers, IEEE International Solid State Circuits Conference, Session 15.

The technique described in the article is named "current sharing", and is implemented in a device using the current where and when it is needed. This circuit functions with a voltage supply of 3 V and may operate at voltages as low as 2.7 V. However, at 2.7 V the phase noise is high and the circuit is not usable for some applications.

Therefore, the conventional D flip-flop circuits have limited use in high speed operations because the power requirement of these circuits is high. Accordingly, there is a need in the art for an improved D flip-flop circuit which operates at high speed with low power consumption, usable in a dual modulus prescaler. There is also a need for a method for reducing the power consumption of an improved D flip-flop circuit.

SUMMARY OF THE DISCLOSURE

It is therefore an object of the present invention to provide a flip-flop circuit which has a reduced power requirement and can operate at high speed. The present invention includes several flip-flop circuit embodiments which can operate at high speed with reduced power requirement, and a corresponding method embodiment for lowering power consumption in such circuits.

A first apparatus embodiment of the present invention includes a D flip-flop circuit operating in master-slave configuration. The D flip-flop is preferably an ECL D flip-flop which includes two latches, each with a switching and memory section, and two interlaced current sources. At the active high clock signal the master latch memory section uses the current from the first current source while the slave latch switching section uses the current from the second current source, and vice versa. The switching section of each latch is biased with a higher current than the memory section, to provide the circuit with low power consumption. Each latching section has a pair of latching transistors, each transistor having its collector connected to a resistor. Each switching section has a pair of switching transistors with the collectors connected to the corresponding bases of the latching transistors.

The second apparatus embodiment of the present invention includes the same circuit as presented in the first apparatus embodiment, except that there are two resistors connected to the collector of each latching transistor instead of one, and the collector of each switching transistor is connected between the two resistors of the corresponding latching transistor.

The method embodiment corresponding to the first and second apparatus embodiment of the present invention includes the steps of providing a first and second current source, providing a master and a slave latch connected to the differential signal output terminals of the master latch, operating the master latch with an active high clock signal in transparent mode while the slave latch is latched, and the slave latch with an active low clock signal in transparent mode while the master latch is latched, clocking the latches in sequence, interlacing the current sources, wherein at the active high clock signal the master latch memory section uses the current from the first current source while the slave latch switching section uses the current from the second current source and vice versa, and biasing the switching section of each latch with a higher current than the memory section.

In every embodiment of the present invention the output current provided to the switching section is preferably substantially twice the magnitude of the current provided to the memory section. The ratio of the currents of the current sources for the switching and memory section is preferably in the range of about 30% to 70%, depending on the clock frequency.

BRIEF DESCRIPTION OF THE DRAWINGS

Referring now to the drawings, in which like reference numbers represent corresponding parts throughout.

DETAILED DESCRIPTION OF PREFERRED EMBODIMENTS

In the following description, reference is made to the accompanying drawings which form a part hereof, and in which are shown, by way of illustration, several embodiments of the present invention. It is understood that other embodiments may be utilized and structural changes may be made without departing from the scope of the present invention.

The present invention relates generally to an improved D flip-flop circuit, usable in a dual modulus prescaler. Specifically, the present invention includes a method for reducing power requirement of a D flip-flop circuit that can operate at high speed, and an ECL D flip-flop digital circuit including two memory elements, each operating as a latch. Outputs of a first memory element are connected to inputs of a second memory element so as to form a shift register.

Figure 3:
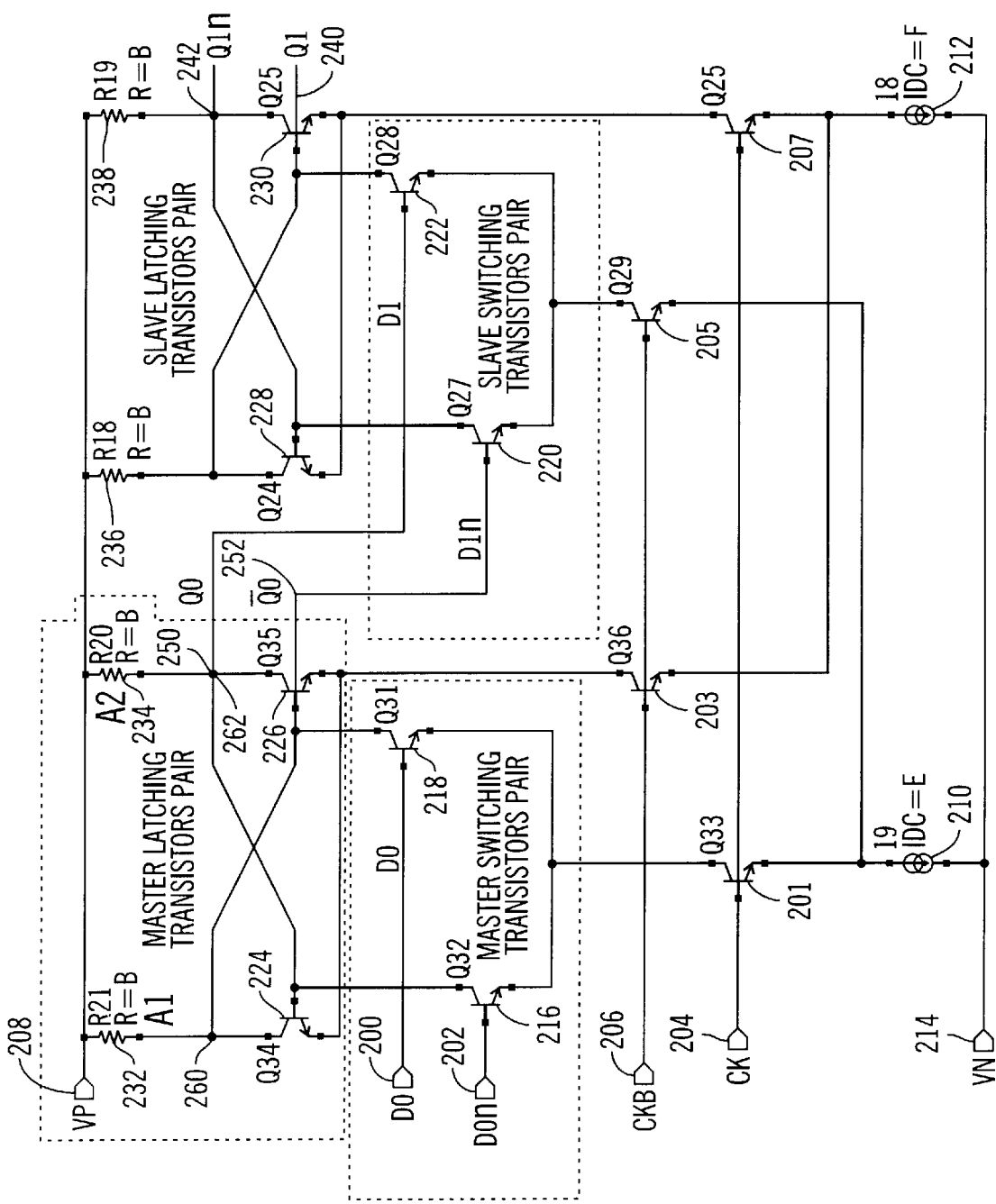
FIG. 3 is a schematic diagram of a D flip-flop circuit according to an embodiment of the present invention.
Figure 4:
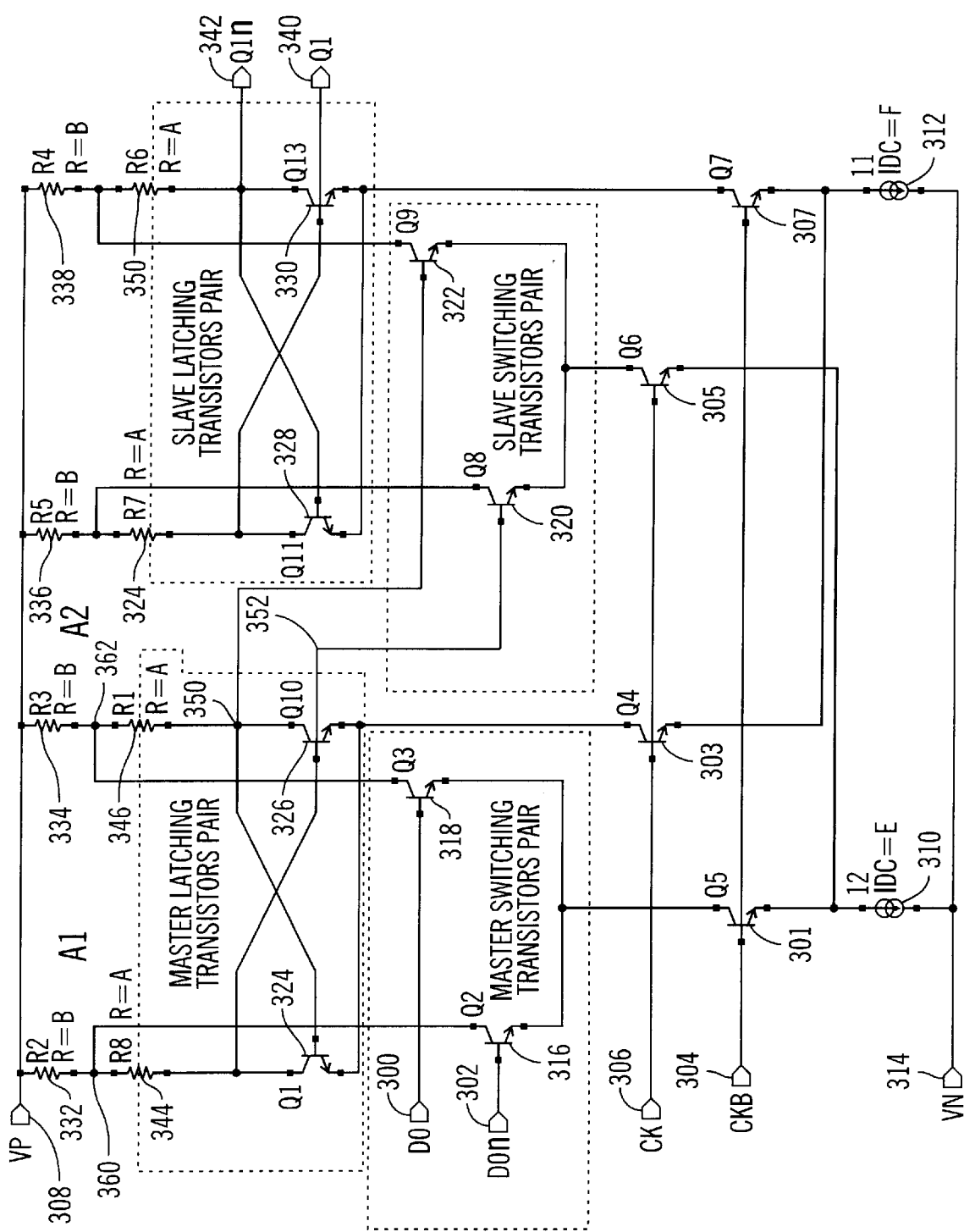
FIG. 4 is a schematic diagram of a D flip-flop circuit according to another embodiment of the present invention.

Preferred embodiments of the present invention are described herein primarily with reference to FIG. 3 and FIG. 4. However, it will be understood that further embodiments are possible with other types of circuits, provided that they utilize the method of the present invention, in order to obtain a D flip-flop circuit with reduced power requirement. Details of the circuit elements presented in FIG. 3 and FIG. 4 are well known in the art and are not described herein for purposes of simplifying the present disclosure.

A D flip-flop can be implemented using different technologies, depending on the application. The present invention is especially usable for high frequency applications, such as in prescalers utilized in PLL loops. In such case it is common to use an ECL D flip-flop because it gives the best performance in term of product current v. delay characteristic. The ECL logic is a non saturating high speed logic and is commonly used in applications where high speed is more important than current consumption. The ECL logic needs a static bias current independent of the working frequency.

According to one preferred embodiment, a schematic diagram of an improved D flip-flop circuit of the present invention is shown in FIG. 3. The device employs a master latch memory cell and a slave latch memory cell. All signals, including input, output and internal signals, are differential signals. In the present invention, each latch is composed of a switching section and a memory section. As shown in FIG. 3, the D flip-flop device is an ECL D flip-flop, and the two latches are connected in the interlaced master-slave topology and clocked in sequence, preferably by non-overlapping clock phases. Thus, the output of the master-slave D flip-flop device is stable during the time its input is being latched.

The circuit of FIG. 3 has four transistors 201, 203, 205, 207 in the input stage, a pair of differential data input terminals 200, 202, a clock input terminal 204, a complement clock input terminal 206, a power supply 208, a pair of current sources 210, 212, a ground level 214, a pair of master switching transistors 216, 218, a pair of slave switching transistors 220, 222, a pair of master latching transistors 224, 226, a pair of slave latching transistors 228, 230, a pair of resistors 232, 234, each one on the collector of the respective transistor 224, 226, a pair of resistors 236, 238, each one on the collector of the respective transistor 228, 230, and a pair of differential output terminals 240, 242. The clock input terminal 204 and the complement clock input terminal 206, which serve as differential clock input terminals, are connected to respective bases of the transistors 201, 207 and 203, 205, respectively. The current sources 210, 212 are connected between the emitter inputs of the transistors 201, 207 and 203, 205, respectively, and the ground level 214.

In this circuit the master and slave latches are interlaced and share the currents from both current sources 210 and 212, which provide bias current to the master cell and the slave cell. The current source 210 supplies the switching sections of both the master and the slave cell, one cell at a time The current source 212 supplies the memory sections of both the master and the slave cell, one cell at a time. The power supply 208 is connected at one end of the resistors 232, 234, 236, 238. Output terminals, output 240 and its complement 242, are connected at the bases of the transistors 230, 228, respectively. The collector of the transistor 201 is commonly connected at the emitters of the transistors 216, 218. The collector of the transistor 203 is commonly connected at the emitters of the transistors 224, 226. The collector of the transistor 205 is commonly connected at the emitters of the transistors 220, 222. The collector of the transistor 207 is commonly connected at the emitters of the transistors 228, 230.

The differential data signal input terminal 200, and its complement 202 are connected at the bases of the transistors 218, 216, respectively. The collectors of the transistors 218, 216 are connected at the bases of the transistors 226, 224, respectively. The collector of the transistor 224 is connected at the base of the transistor 226, and the collector of the transistor 226 is connected at the base of the transistor 224. Preferably, each transistor used in the present invention is an NPN transistor, implemented in bipolar or CMOS technology, or any other suitable device. The current source 210, 212 may be any suitable current source configured to provide a current. The power supply 208 is preferably a DC voltage level.

The D flip-flop device of FIG. 3 is synchronized using a clock signal. The two latch cells in master-slave configuration operate one with an active high clock signal and the other with an active low clock signal. The data from the data inputs 200, 202 enters the master cell when the clock signal is high. When the clock input 204 is high (complement clock input 206 is low) the master latch is transparent and the slave latch is latched; the opposite is true when the clock input 204 is low. Therefore, the switching section, while the latch is in transparent state, allows the latch to acquire the state, which is afterwards held by the memory section. Therefore, the switching function is dynamic while the memory function is static. On the active edge of the clock signal 204, in this case the negative edge, when the clock signal goes low, the data moves from the master cell to the slave cell and thus to the outputs 240, 242. The outputs 240, 242 may change value only on the clock edge.

Therefore, in operation, when the clock input signal 204 applied to the transistors 201, 207 is of a high level, input information supplied to the differential data input terminals 200, 202 is written into the transistors 224, 226, respectively, which are in a differential stage. When the clock input signal applied to the transistors 201, 207 is of a low level, the information which has been written into the transistors 224, 226 at a time the clock input signal is of a high level is latched by a latch that is composed of the transistors 228, 230 and stores the data.

In the circuit of FIG. 3, the clock toggles at very high frequency and the clock signal 204 is high, when the master latch is transparent, for a limited amount of time. In order to have a transition at the data input signal 200, 202 go through and appear at the output 250, 252, the master switching section has to be very fast, thus needing high current. When the master latch is in latched state it does not need to be fast, thus requiring less current. The same applies to the slave latch.

Figure 1:
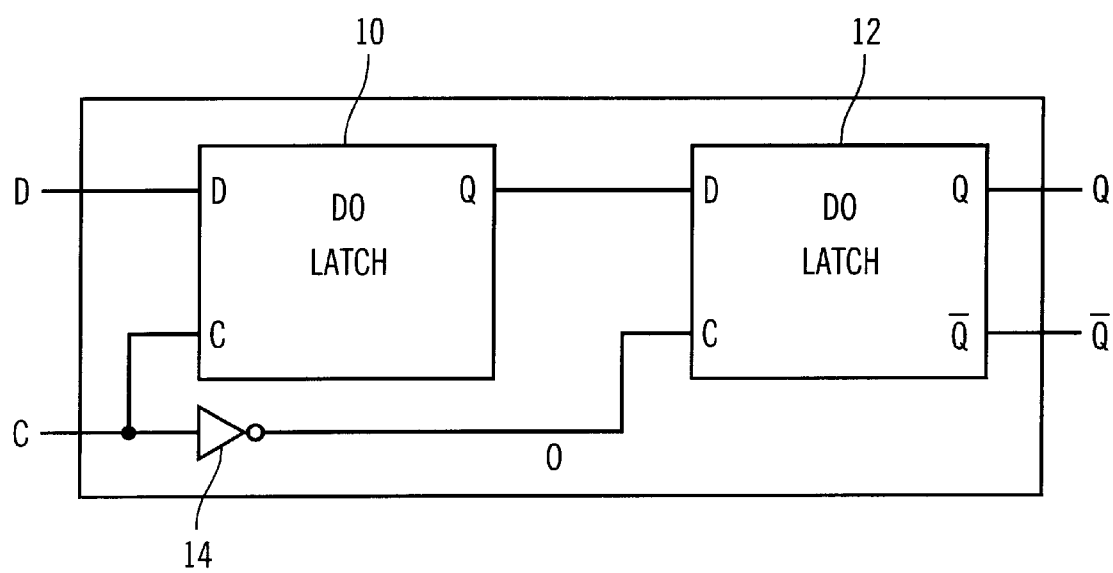
FIG. 1 is a block diagram of a conventional flip-flop circuit.
Figure 2:
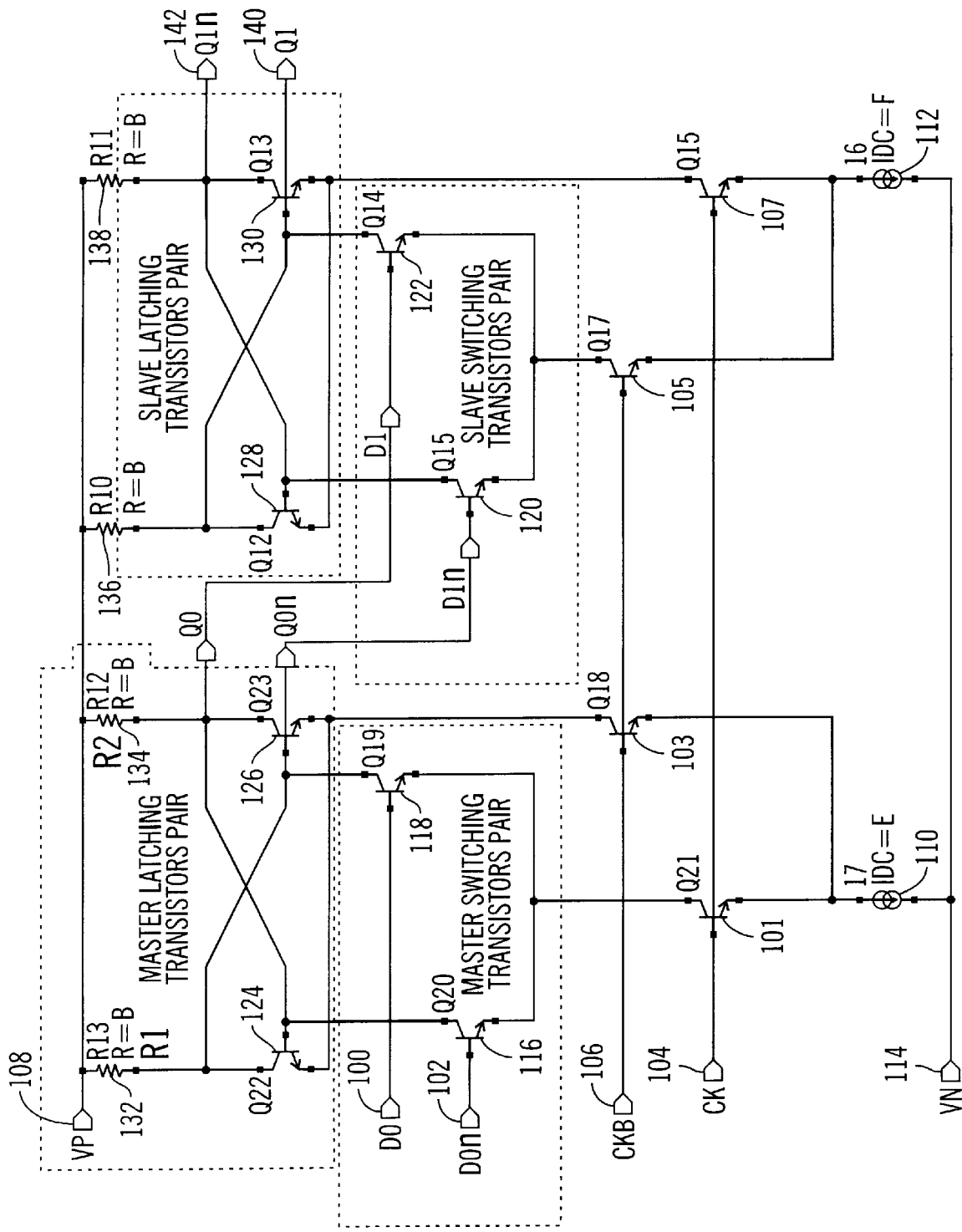
FIG. 2 is a schematic diagram of a conventional D flip-flop circuit.

Due to this principle, the embodiments of the present invention shown in FIG. 3 and FIG. 4 are designed so that there are two separate sections in each ECL latch, namely the switching and memory section. Moreover, the D flip-slop is configured so that the output current provided by the current source 210 is preferably substantially twice the magnitude of the current provided by the current source 212. The ratio of the currents of the current sources 210, 212 may be in the range of about 30% to 70%, and is dependent on the clock frequency. Therefore, the switching section of each latch is biased with a higher current, when the latch is in transparent state and when gain and speed is required, than in the memory section, which performs a static storage function with less current. In some applications it may be beneficial to keep the current magnitudes the same. If the magnitudes of the currents provided by the current sources 200, 212 are identical and same as in the circuit of FIG. 2, the circuit of the present invention performs faster.

Because of the differential nature of an ECL digital cell, if there is only one latch in a device used alone it is very difficult to obtain good performance with less current in the memory section. Because the changing of the bias current between transparent and latched mode has to be very fast, extra circuit elements are needed in the one-latch device. Therefore, in the present invention each latch is designed to be used with its complementary twin latch, as a mirror circuit represented with another ECL latch, in a master-slave configuration. The two latches jointly form the ECL D flip-flop of FIG. 3 and FIG. 4.

Therefore, the method embodiment of the present invention for reducing the power consumption of the D flip-flop circuit of FIG. 3, includes the steps of providing a first and second current source, providing a master and slave latch connected to the differential signal output terminals of the master latch, operating the master latch with an active high clock signal in transparent mode while the slave latch is latched, and the slave latch with an active low clock signal in transparent mode while the master latch is latched, clocking the latches in sequence, interlacing the current sources, wherein at the active high clock signal the master latch switching section uses the current from the first current source while the slave latch memory section uses the current from the second current source and vice versa, and biasing the switching section of each latch with a higher current than the memory section.

FIG. 4 represents another embodiment of the present invention incorporating the same circuit design and having the same elements as the embodiment shown in FIG. 3. In the circuit of FIG. 3 both the master and slave latch share the current from two current sources 210 and 212. At each point in time, the current source 210 is used to bias the switching section of one latch and the current source 212 is used to bias the memory section of another latch. The two bias currents are steered from the master to the slave by the clock signal. When the master latch is using the current from the current source 212 for memory state, the slave latch is using the current from the current source 210 for switching state. This allows a saving in current consumption of about 30%, when compared to the conventional device of FIG. 2.

In the embodiment of FIG. 3 the collectors of each switching transistor pair are connected to the corresponding bases of the latching transistor pair. The ratio of the differential output voltage signals at nodes 260, 262, when the master latch is in transparent mode and when it is latched, is determined by the ratio of the magnitude of the switching current from the current source 210 and the magnitude of the memory current from the current source 212. When the master latch goes into latch state, the magnitude of the output voltage signal drops because of the difference in magnitudes of the currents from the current sources 210, 212. This is not a problem at high frequency, because the capacitive loads at the nodes 260, 262 do not allow fast transition of the output voltage. However, at low frequency this may be a problem during latch state because this output voltage drop can reduce noise immunity. The same principle applies to the slave latch.

To overcome this problem in the embodiment of the present invention shown in FIG. 4, each resistive load 232, 234, 236, 238 is split into two parts, and thus each memory section is using a pair of resistor loads such as 332 and 344, 334 and 346, 336 and 348, 338 and 350. Instead of being connected to the base, the collectors of each switching transistor pair are connected between the two resistors of a corresponding resistor pair. With this configuration it is possible to keep the magnitude of an output voltage signal from a latch the same during switching and latching state, when E*RA=F* (RA+RB), where E is the current used during the switching state. F is the current used during the latched state, RA is, for example, the load resistor 332, and RB is, for example, the load resistor 344 of the same pair. In this way the circuit of FIG. 4 works as a static flip-flop. At lower frequencies there is smaller output current so an output parasitic capacitance needs more time to discharge. In order for that capacitance to be discharged at low frequency, a higher output voltage is needed and the additional resistor of each pair provides this boost in voltage.

The circuits of FIGS. 3, 4 may operate at 2.4 V, when the output voltage drop of two diode voltages allows transistors Q2 and Q5 to work without any saturation problem. The digital circuits of the present invention may also allow integration of a two-input combinatory gate circuit, not shown, having a plurality of outputs connected to the inputs of the memory cells, when the minimum voltage supply has to be increased to 2.7 V.

With the method and the improved D flip-flop circuits of the present invention, it is possible to obtain a 30% decrease in power consumption, relative to the power required in a conventional circuit. Moreover, the ECL D flip-flop digital circuits of the present invention work with reduced power consumption without altering their performance. When designed, the circuits of FIG. 3 and FIG. 4 were implemented in dual modulus prescalers, represented with a 4/5 divider. The simulation results proved that the circuits needed 2.1 mA current source to work at 2.4 GHz, 2.7 V and 100° C. These results show a reduction of the overall current consumption in the prescaler by 30% and a reduced load of a preamplifier, used to drive the prescaler. Moreover, the devices of the present invention may be used with different power supplies, a 2.4 V power supply or a 2.7 V power supply, with one level of combinatory logic build in. The simulation has shown that the digital circuits of the present invention do not have significantly lower speed when compared with the conventional ECL D flip-flop of FIG. 2. Therefore, the embodiments of the present invention find application in devices capable of high-speed operation, which require low power consumption.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A D flip-flop circuit operating in master-slave configuration at high speed with low power consumption, comprising:

a first current source;

a second current source;

a ground level;

a master latch having a switching section and a memory section, a pair of data input terminals and a pair of differential signal output terminals;

a slave latch having a switching section, a memory section, and a pair of differential signal input terminals connected to the differential signal output terminals of the master latch;

a power supply connected to said first and second latch;

said master latch operating with an active high clock signal and transparent while the slave latch is latched, and the slave latch operating with an active low clock signal and transparent while the master latch is latched, said latches clocked in sequence;

said first and second current sources being interlaced, wherein at the active high clock signal the master latch switching section uses the current from the first current source while the slave latch memory section uses the current from the second current source, and at the active low clock signal the master latch memory section uses the current from the second current source while the slave latch switching section uses the current from the first current source; and the switching section of each said latch biased with a higher current than the memory section, thereby resulting in the D flip-flop with low power consumption.

2. The circuit of claim 1 wherein the output current provided by the first current source is substantially twice the magnitude of the current provided by the second current source.

3. The circuit of claim 1 wherein the ratio of the currents of the first and the second current source is substantially in the range of about 30% to 70%, depending on the clock frequency.

4. The circuit of claim 1 wherein the D flip-flop device is an ECL D flip-flop having a plurality of NPN transistors, implemented in bipolar or CMOS technology.

5. The circuit of claim 4 wherein each said latch comprises:

a pair of input transistors, one said input transistor having the base connected to the active high clock signal, and the other said input transistor having the base connected to the active low clock signal, respectively;

a pair of switching transistors;

the first current source connected between the emitter input of one input transistor and the ground level, and the second current source connected between the emitter input of another input transistor and the ground level;

a first and second latching transistor;

the collector of one input transistor commonly connected at the emitters of the switching transistors;

the collector of the other input transistor commonly connected at the emitters of the latching transistors; and one differential signal output terminal at the collector of the first latching transistor connected at the base of the second latching transistor, and another differential signal output at the collector of the second latching transistor connected at the base of the first latching transistor; and wherein the pair of master latch data input terminals are connected at the corresponding bases of the switching transistors.

6. The circuit of claim 5 wherein each said latching transistor has its collector connected to a resistor, said resistor connected to the power supply; and the collectors of the switching transistors connected to the corresponding bases of the latching transistors.

7. The circuit of claim 5 wherein each said latching transistor has its collector connected to a first and a second resistor connected in a sequence, said second resistor connected to the power supply; and the collector of each said switching transistor connected between said first and second resistor of the corresponding latching transistor.

8. A method for lowering power consumption of a D flip-flop circuit operating in master-slave configuration at high speed, comprising the steps of:

providing a first and second current source;

providing a master latch having a switching section, a memory section, and a pair of differential signal output terminals;

providing a slave latch having a switching section, a memory section, and a pair of differential signal input terminals connected to the differential signal output terminals of the master latch;

operating said master latch with an active high clock signal in transparent mode while the slave latch is latched, and the slave latch with an active low clock signal in transparent mode while the master latch is latched;

clocking said latches in sequence;

interlacing said first and second current source, wherein at the active high clock signal the master latch switching section uses the current from the first current source while the slave latch memory section uses the current from the second current source, and at the active low clock signal the master latch memory section uses the current from the second current source while the slave latch switching section uses the current from the first current source; and biasing said switching section of each said latch with a higher current than the memory section, thereby resulting in the D flip-flop with low power consumption.

9. The method of claim 8 wherein the output current provided by the first current source preferably substantially twice the magnitude of the current provided by the second current source.

10. The method of claim 8 wherein the ratio of the currents of the first and the second current source is substantially in the range of about 30% to 70%, depending on the clock frequency.

* * * * *